United States Patent [19]

Oldenkamp

[11] 4,422,163
[45] Dec. 20, 1983

[54] POWER DOWN CIRCUIT FOR DATA PROTECTION IN A MICROPROCESSOR-BASED SYSTEM

[75] Inventor: Ralph J. Oldenkamp, Foster City, Calif.

[73] Assignee: Vend-A-Copy, Inc., Dallas, Tex.

[21] Appl. No.: 299,255

[22] Filed: Sep. 3, 1981

[51] Int. Cl.³ .............................................. G11C 7/00
[52] U.S. Cl. ..................................................... 365/229
[58] Field of Search ................................. 365/228, 229

[56] References Cited

U.S. PATENT DOCUMENTS

| | | | |
|---|---|---|---|
| 3,859,638 | 1/1975 | Hume | 365/229 |
| 4,122,359 | 10/1978 | Breikss | 365/229 |
| 4,323,987 | 4/1982 | Holtz et al. | 365/229 |
| 4,337,524 | 6/1982 | Parkinson | 365/229 |
| 4,365,316 | 12/1982 | Iwahashi et al. | 365/229 |

FOREIGN PATENT DOCUMENTS 52-11722   1/1977   Japan ................................. 365/229

*Primary Examiner*—Stuart N. Hecker
*Attorney, Agent, or Firm*—Townsend and Townsend

[57] ABSTRACT

An apparatus for use in a stand alone microcomputer controlled system having a digital memory device and a microprocessor unit includes a small battery supply and circuitry for sensing the power applied at the power terminals of the microprocessor unit and the digital memory device to control initial power application and power supply failure in a manner to prevent loss of volatile digital data. The memory power requirements in the power off or standby mode are approximately 1000 times less than in the operating mode thereby to permit volatile data to be stored in a volatile random access memory for a substantial time independent of system power. The monitoring circuitry includes circuitry for detecting the power levels, switching the power, disabling the memory device in the microprocessor, and for restarting the microprocessor once power has been restored. Specifically, the circuitry comprises first and second comparators coupled in cascade, one of which senses the voltage level the other acting as a portion of a switch for disabling the memory device, timing capacitors and switching diodes for decoupling the power supply from the backup battery supply.

4 Claims, 2 Drawing Figures

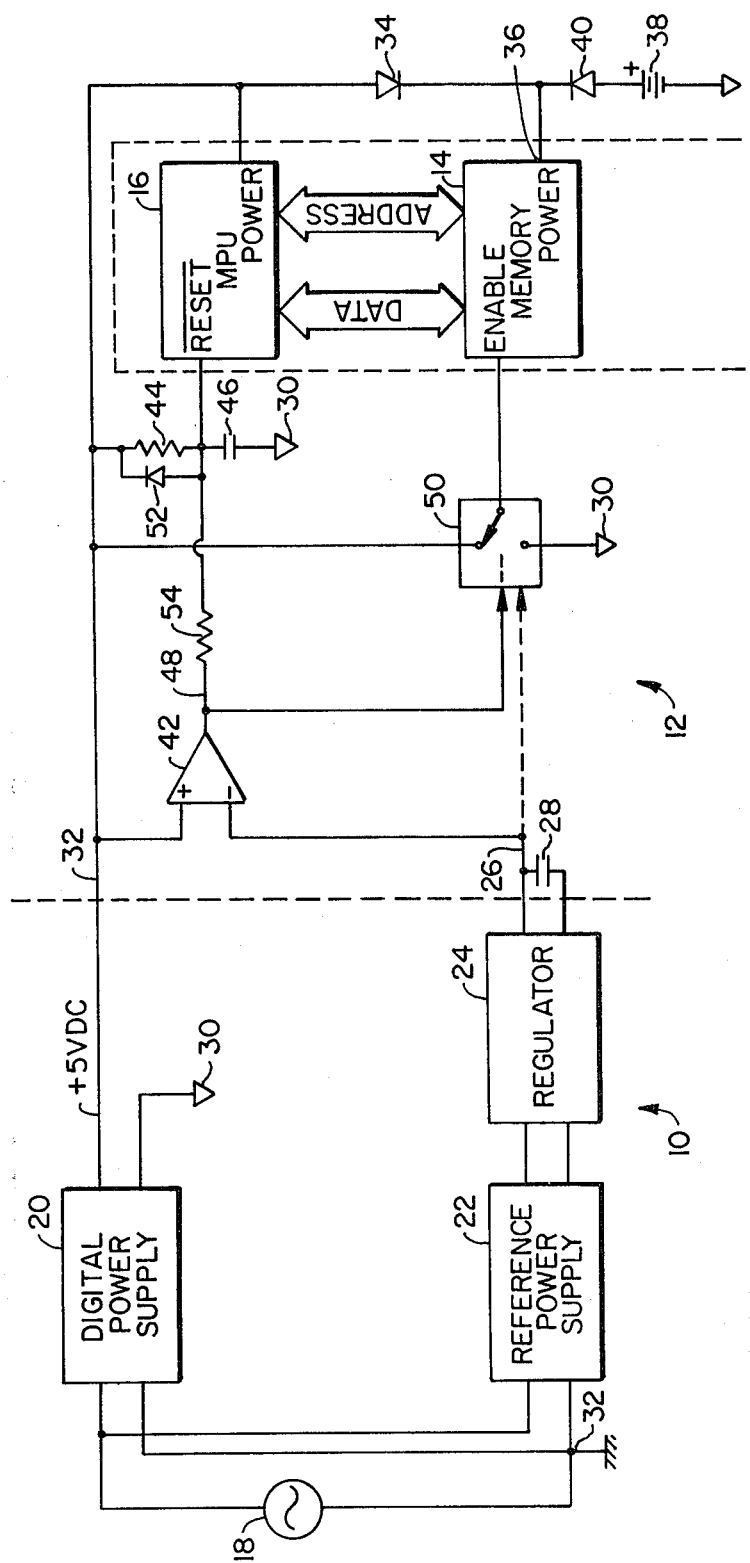
FIG._1.

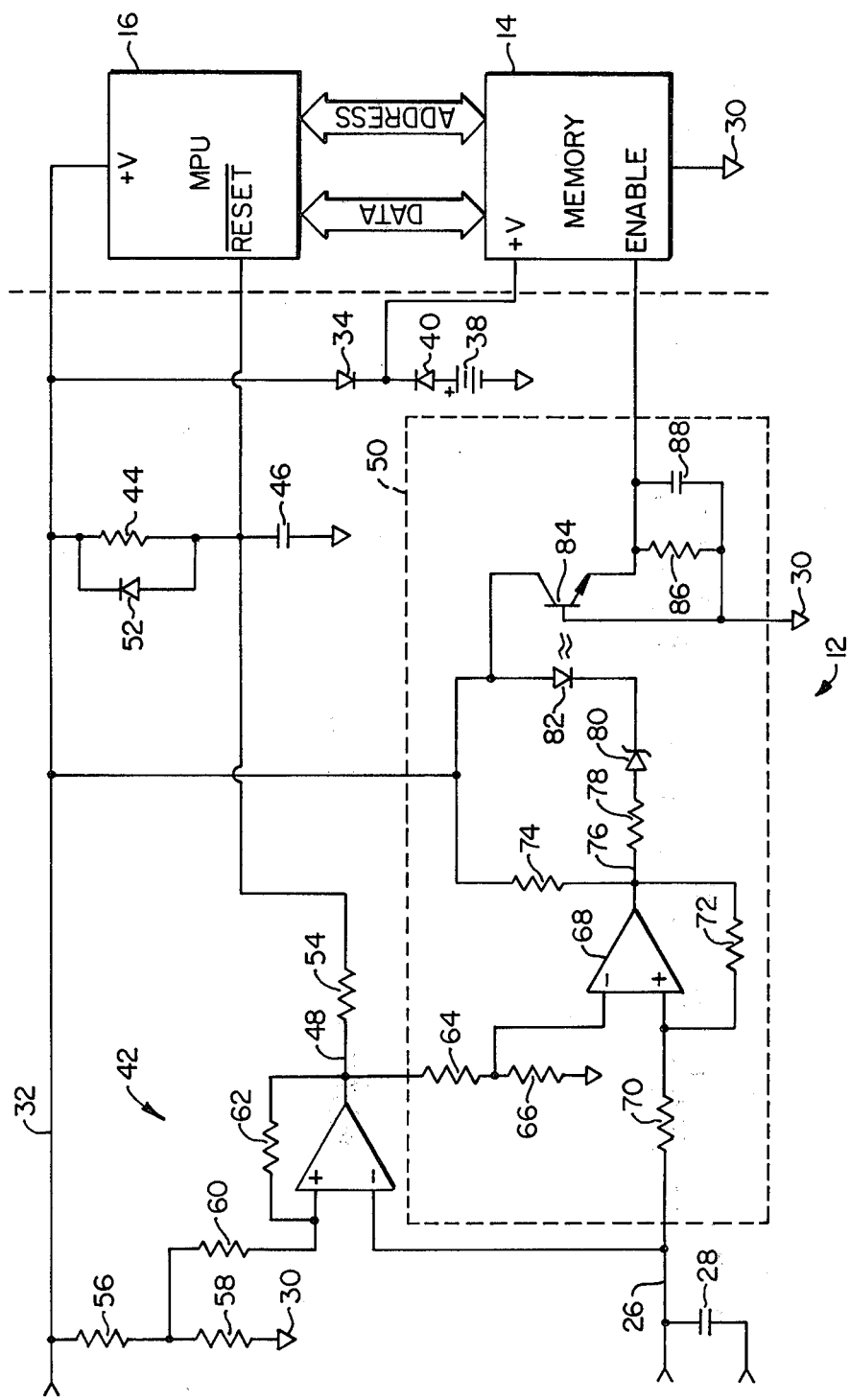
FIG._2.

POWER DOWN CIRCUIT FOR DATA PROTECTION IN A MICROPROCESSOR-BASED SYSTEM

BACKGROUND OF THE INVENTION

1. Field of Invention

This invention relates to microprocessor-based systems and particularly to battery backup of erasable memory in microprocessor-based systems.

In many microcomputer-based products, such as microprocessor-based photocopy sysems, there is a need to save pertinent volatile data during periods when the main power source to the system is interrupted. Such data may include indicators controlling use of the machine, counters, flags, check data, and information about work in process. Such data are generally stored in volatile random access memory, as opposed to nonvolatile read only memory.

2. Description of the Prior Art

Various techniques and methods have been employed for preserving volatile data in computer systems. The typical system is an uninterruptible power supply with sophisticated circuitry for sensing irregularities in the AC power source. Such systems are normally intended to enable continuous operation even upon interruption of power. Uninterruptible power supplies are generally expensive and not suited to microprocessor-based systems, particularly because the sophistication and expense of generally available uninterruptible power supplies may exceed that of the systems intended to be supported. What is therefore needed is a simple yet effective technique and apparatus for preventing loss of important information in systems where operation is permitted to be interrupted.

SUMMARY OF THE INVENTION

According to the invention, an apparatus is provided for use in a stand alone microcomputer controlled system having a digital memory device and a microprocessor unit which includes a small battery supply and circuitry for sensing the power applied at the power terminals of the microprocessor unit and the digital memory device to control initial power application and power supply failure in a manner to prevent loss of volatile digital data. The memory power requirements in the power off or standby mode are approximately 1000 times less than in the operating mode thereby to permit volatile data to be stored in a volatile random access memory for a substantial time independent of system power. The monitoring circuitry includes circuitry for detecting the power levels, switching the power, disabling the memory device in the microprocessor, and for restarting the microprocessor once power has been restored. Specifically, the circuitry comprises first and second comparators coupled in cascade, one of which senses the voltage level the other acting as a portion of a switch for disabling the memory device, timing capacitors and switching diodes for decoupling the power supply from the backup battery supply. Other details of the invention will be apparent by reference to the following description of specific embodiments taken in connection with the accompanying figures.

BRIEF DESCRIPTION OF THE DRAWINGS

FIG. 1 is a block diagram of one embodiment of the invention.

FIG. 2 is a schematic diagram of a circuit according to the invention.

DESCRIPTION OF SPECIFIC EMBODIMENTS

Referring to FIG. 1 there is shown a system power supply 10, a power down circuit 12, a digital memory device 14 and a microprocessor unit 16 of a microcomputer-based system.

The system power supply 10 includes an AC power source 18 which is subject to interruption, such as through a wall plug, an AC to DC digital power supply 20 coupled to the AC power source 18 and operative to convert the AC power into 5 volts DC for use in driving digital circuits, a reference power supply 22 coupled to the AC power source to supply a DC voltage, such as 12 volts to a regulator 24. The output of the regulator 24 is a reference on reference line 26 across a storage capacitor 28.

It is desirable to provide isolation between the digital power supply 20 and the reference power supply 22. Accordingly, the ground return of the regulator 24 is through the reference power supply 22 and the ground return of the digital power supply 20, herein designated common ground 30 is coupled through the digital power supply 20 to a common chassis ground 32.

The microprocessor unit 16 is coupled through data and address buses to the digital memory device 14. Only two terminals of the microprocessor unit 16 are relevant to this invention, namely, the $\overline{\text{RESET}}$ and the power terminals. The power terminal may be supplied by the digital power terminal supply 20 or by another source not shown. The $\overline{\text{RESET}}$ terminal is generally monitored to determine the status of operation of the microprocessor unit 16.

As part of the power down circuit, the output of the digital power supply 20 provided over a power line 32 is through a first diode 34 to the power input terminal 36 of the memory 14. According to the invention, a backup battery 38 is coupled to the power input terminal 36 through a second diode 40. In operation, whenever the voltage on the power line 32 drops below the voltage range of the battery 38, the first diode 34 becomes reverse biased and the second diode 40 becomes forward biased, switching off power from the digital power supply 20 and switching power from the battery 38 to the power input terminal 36. The circuit's prime function is to disable the memory 14 during periods of insufficient available power to assure proper operation of the microprocessor unit 16. For this purpose, a first comparator 42 is provided which has one input coupled to the reference line 26 and its other input coupled to the power line 32 monitoring the power level at the power input terminal 36. The bias of the first comparator 42 is selected to assure switchover whenever the voltage on the power line 32 drops below a predetermined level.

In operation, the output of the first comparator 42 is normally high, i.e., at 5 volts. A resistor and capacitor network comprising a resistor 44 and a reset capacitor 46 is disposed across the output of the first comparator 42. The resistor 44 is coupled between the power line 32 and the output of the first comparator 42, through a line hereinafter designated a reset control line 48. The reset control line 48, including a resistor 54, is also used to control a switch means, as hereinafter explained. The reset capacitor 46 is coupled between the reset control line 48 and common ground 30. The time constant of the resistor 44 and reset capacitor 46 is chosen to produce a time delay for power up sequences. Resistor 54, in connection with capacitor 46, defines the time constant employed in a power down sequence.

The reset control line 48 provides a volage level which is used to control the switch means 50. The switch means 50 monitors the voltage on control line 48 to determine the running status of the microprocessor unit 16. It is operative to switch between the digital voltage level on power line 32 and common ground 30. The output of the switch means 50 is applied to the ENABLE input of the digital memory device 14 to control the operation of and access to the digital memory device 14.

A third diode 52 is coupled across the resistor 44 to protect the circuit and assure discharge of capacitor 46 in the event comparator 42 fails to operate as intended. It becomes forward biased whenever the voltage level on power line 32 drops significantly below the voltage level on reset control line 38. In that case, the diode 52 ensures that the potential on the RESET input of the microprocessor unit 16 maintained by capacitor 46 shall not exceed the decaying supply voltage.

Turning to FIG. 2, a circuit according to the invention is shown in greater detail. The same numerals as are used in FIG. 1 are carried over into FIG. 2. The first comparator 42 comprises, for example, a two input operational amplifier having an open collector output which is tied to the power line 32 through resistor 44 and resistor 54. The sensed voltage level applfied to the sensing input of the first comparator 42 is by means of a voltage divider comprising resistors 56 and 58 between the power line 32 and common ground 30. The divided voltage levels applied through a high impedance resistor 60 which in conjunction with a resistor 62 and the positive feedback loop controls the voltage level at reset control line 48. The reference control line 26 is provided with a voltage which is less than but close to the bias set by divider resistors 56 and 58. The output on reset control line 48 is provided through a resistor divider comprising resistors 64 and 66 to the inverting input of a second comparator 68. A reference value is provided through a resistor 70 from reference line 26 to the noninverting input of the second comparator 68. A resistor 72 in the positive feedback loop of the second comparator 68 adds hysteresis. The second comparator 68 is an operational amplifier with an open collector output tied to a high voltage on power line 32 through a resistor 74.

The second comparator 68 provides a control signal on a load output line 76 to a resistor 78 and through a Zener diode 80 to the cathode of a light emitting diode 82. The anode of the light emitting diode 82 is coupled to the power line 32. Whenever the light emitting diode 82 is on, i.e., when the voltage at the load output line 76 is sufficiently low to cause the light emitting diode 82 to conduct through the Zener diode 80, a photo transistor 84 is turned on causing it to conduct current to its load. The photo transistor 84 has an emitter follower load resistor 86 which is coupled across the ENABLE input of the memory device 14. A small capacitor 88 is coupled across the load resistor 86 to control transient decay and excitation.

The digital memory device 14 is, for example, a type MWS5101EL-3 256×4 static random access memory device, which is a device based on standard CMOS technology. Any volatile memory device having an ENABLE input is capable of operation in accordance with the invention so long as it is capable of retaining data at the standby voltage level established by the battery. The ENABLE input operates to disable the memory device whenever the terminal thereof is low. The battery 38 is for example two ZM-9 1.4 volt mercury cells coupled in series across the voltage input of the memory device 14. Mercury cells have been found to provide a standby life of about 12–18 months under normal conditions, which corresponds to the approximate shelf life of such a battery cell. A CMOS memory device with low standby voltage has a power drain which is sufficiently low that batteries physically deteriorate prior to drop in load voltage below an acceptable standby level. Mercury cells are preferred over other cells because of favorable voltage discharge characteristics, reliability, relatively low cost and long operating life.

The device 12 in a power down mode has three principal functions, namely, to sense circuit voltage to determine the conditions of the voltage applied to the memory device 14, to isolate the memory device 14 from the digital power source 20 and microprocessor unit 16 under low voltage conditions, and to seize control of the microprocessor unit 16 when it is determined that circuit power is outside of acceptable voltage limits. In the power application, the device 12 assures orderly start up. It prevents the memory device 14 from coming on line before the microprocessor unit 16 executes any necessary initialization instructions. The ability of the device to seize control of the microprocessor unit 16 assures that the microprocessor unit 16 does not execute instructions in error during power down, power up and low voltage (brown-out) conditions.

To more fully understand the invention, it is important to understand the operating modes. When a microprocessor-based system is operating at normal power level, the first comparator 42 allows the voltage on the reset control line 48 to be at a level sufficiently high to maintain the RESET terminal of the microprocessor unit 16 active (e.g., $\overline{\text{RESET}}$ inactive). Specifically, it allows the RESET terminal to be drawn high through resistor 44. The voltage applied at resistor 44 also establishes the voltage level through resistors 64 and 66 which is sensed at the inverting input of second comparator 68. The voltage on reset control line 48 which is sensed through resistor divider 64, 66 at the inverting input of the second comparator 68 compares the voltage with the generally lower voltage at reference line 26. Consequently, the load output line 76 is held at a low level, specifically at or near ground potential. This causes the LED 82 to conduct, turning on the photo transistor 84.

The photo transistor is thereby turned on in order to switch the voltage across the follower resistor 86 to a high logic level, which logic level is applied to the enable control input of the memory device 14. The memory device 14 can therefore interact with an active microprocessor unit 16 through data and address buses.

When power failure is sensed, however, the first comparator 42 senses the drop in power applied to the memory 14 through the line 32 by means of the divider resistors 56 and 58. This voltage is compared with the reference level on reference line 26. The comparator 68 may be powered by the system 5V power supply or by a separate power supply at a level of typically 12 volts. The comparator 68 is generally stable at any power supply voltage above 2 volts. The inherent time constant of the separate power supply is sufficiently long to permit comparator operation during the initial period following main power interruption. The reference line 26 will maintain its voltage at least for a period sufficient to allow the comparator 42 to change states. Upon detecting the low state, the comparator 42 switches to a low state to begin to discharge the reset capacitor 46.

The output of comparator 42 at reset control line 48 is also applied across resistor divider 64 or 66 to the noninverting input of the second comparator 68, which in turn immediately switches to a high state, forward biasing the Zener diode 80 and reverse biasing and turning off the light emitting diode 82. Once the light emitting diode 82 has been turned off, the photo transistor 84 is turned off causing the follower resistor 86 to begin to discharge the capacitor 88 across the enable input terminal of the memory 14. The time constant of the resistor 86 and capacitor 88 is shorter than the time constant of resistor 54 and capacitor 46 to assure that the memory device 14 is disabled before damage can be done to memory contents by loss of power to the power input and attempted access to the contents thereof.

The reset capacitor 46 continues to discharge and eventually reaches a level whereupon the microprocessor unit 16 is held at the RESET. The design voltage for RESET is typically on the order of 3 volts. This action effectively halts operation of the microprocessor unit 16 long before the applied power deteriorates sufficiently to cause erratic behavior or breakdown of operation. Once the supply voltage across diode 34 is dropped below the voltage level of the standby battery 38 (plus a diode voltage drop), the battery is switched into power supply circuit. Thereafter, the contents of volatile memory in the memory device 14 is maintained on standby power.

The power down circuit 12 must also be capable of bringing power up in an orderly manner and stabilizing the comparators 42, 68, microprocessor unit 16 and memory device 14. For example, as power is applied to power line 32 causing a transient increase in voltage, the comparators are activated. Zener diode 80 blocks any low level transients to the memory 14 until the power line voltage level increases above the level necessary to cause the output control line 48 to switch high. Switching of the output control line 48 to a high state causes capacitor 46 to start charging. At a level of +3 volts, the processor unit 16 is activated. As the voltage continues to rise across the reset capacitor 46, and after the RESET terminal has been activated to initialize the microprocessor unit 16, the second comparator 68 is activated causing the LED 82 to switch on. The LED 82 turns on the photo transistor which applies a high logic level signal to the ENABLE input of the memory 14. With the enable line 14 active and the microprocessor unit 16 operating, the microprocessor based system is ready to resume operation according to the invention.

Certain features of the invention enhance its operation. For example, resistors 62 and 72 provide hysteresis control for the comparators 42 and 68. Resistor 74 pulls up the voltage at the output the second comparator 68 to the full level of the voltage supply, which would otherwise take place through diodes 80 and 82 to the power source.

Time constants are selected so that the processor has enough time to initialize after power up before the memory device 14 is enabled. For example, the time constant for the reset capacitor 46 is selected so that reset occurs about one-half second after power is reapplied to the microprocessor unit 16. The increasing voltage on the reset capacitor is sensed at voltage dividers 64, 66. The values of the voltage dividers 64, 66 are chosen so that the input to the second comparator 68 is equal to the reference input voltage through reference line 26 approximately one-half second after the reset voltage is achieved as the microprocessor unit 16.

The invention has now been explained with reference to specific embodiments. Other embodiments will be apparent to those of ordinary skill in the art. It is therefore not intended that this invention be limited except as indicated by the appended claims.

I claim:

1. In a microprocessor-based system having a digital memory device which is subject to erasure of contents upon loss of electrical power thereto and having a microprocessor unit, said digital memory device having an enable control for enabling and disabling operation of said digital memory device, and said microprocessor unit having a reset control for reinitializing operation of said microprocessor unit, an apparatus for preventing loss of digital information stored in said digital memory device during periods of inadequate power from a main power supply, said apparatus comprising:

DC battery means switchably coupled to a power supply terminal of said digital memory device;

means coupled to sense power level applied to said digital memory device at said power supply terminal and to sense power level applied to said microprocessor unit at a power supply terminal of said microprocessor unit for detecting a drop in power to said digital memory device and to said microprocessor unit, wherein said detecting means comprises a first comparator having as one input a reference voltage having a decay time constant greater than the decay time constant of said main power supply, said first comparator having as its other input voltage sense at the power supply terminal of said microprocessor unit, wherein the output of said first comparator is coupled to drive said switching means and with said microprocessor unit disabling means;

means responsive to said detecting means for disabling said digital memory device immediately upon a detected drop in power to said digital memory device thereby to prevent erasure of information in said digital memory device, wherein said microprocessor unit disabling means comprises a resistor coupled between the output of said first comparator and a RESET terminal of said microprocessor unit and a capacitor coupled between said RESET terminal and ground to form an R-C network;

means responsive to a sensed drop in power to said power terminal of said digital memory device and operative to switch said battery means to said power terminal of said digital memory device for preventing loss of information in said digital memory device, wherein said power loss preventing means comprises a first diode and a second diode, said first diode being disposed to conduct current between said battery and said power supply terminal of said digital memory device and said second diode being coupled to conduct power from said main power supply to said power supply terminal of said digital memory device, wherein said switching means comprises a second comparator having as one input said reference voltage and as its other input the output of of said first comparator, and an isolation network coupled to receive an output of said second comparator, said isolation network having an output which is controllably switchable between a normally high voltage level and ground potential, said isolation network output being coupled to a control input of said digital memory device to enable operation, wherein said isolation network is coupled to said high voltage level at the power supply terminal of said microprocessor unit, and wherein said R-C network further includes a diode across said resistor which is normally forward biased only when voltage at said microprocessor unit power supply terminal is less than the voltage across said capacitor for assuring discharge of said capacitor; and means for disabling said microprocessor unit.

2. The apparatus according to claim 1 wherein said isolation network comprises an optoelectronic switch comprising a light emitting diode and a photo transistor, said photo transistor being coupled to drive the enable terminal of said digital memory device through an emitter follower load resistor.

3. The apparatus according to claim 2 wherein said switching means further comprises a Zener diode between said second comparator and said isolation network for threshold voltage control.

4. The apparatus according to claim 1 wherein said DC battery means has a standby voltage which is less than a designated design operating voltage for said digital memory device but sufficient to maintain digital information therein against erasure.

* * * * *